United States Patent [19]

Miyamura et al.

[11] Patent Number: 4,694,431

[45] Date of Patent: Sep. 15, 1987

[54] SEMICONDUCTOR MEMORY DEVICE WITH INCREASED ADAPTABILITY

[75] Inventors: Tamio Miyamura; Takashi Ohkawa, both of Kawasaki, Japan

[73] Assignee: Fujitsu Limited, Kanagawa, Japan

[21] Appl. No.: 779,013

[22] Filed: Sep. 23, 1985

[30] Foreign Application Priority Data

Sep. 25, 1984 [JP] Japan ................. 59-198607

[51] Int. Cl.⁴ .............................. G11C 7/00
[52] U.S. Cl. ..................... 365/189; 365/104
[58] Field of Search ............ 365/94, 103, 104, 189, 365/174

[56] References Cited

U.S. PATENT DOCUMENTS 4,347,584  8/1982  Fukushima et al. ............. 365/104

Primary Examiner—James W. Moffitt
Assistant Examiner—Glenn A. Gossage
Attorney, Agent, or Firm—Armstrong, Nikaido, Marmelstein & Kubovcik

[57] ABSTRACT

A semiconductor memory device having a PROM with an output register has an initialize input terminal and a programmable initial data memory cell for each bit. When an initialize input signal is supplied to the initialize input terminal, the output register is cleared or present in accordance with the content of the initial data memory cell, whereby the reduction of adaptability caused by a decrease in input terminals can be prevented, a circuit arrangement can be simplified, and a high degree of integration and high-speed operation can be achieved.

6 Claims, 20 Drawing Figures

TRUTH TABLE (1)
(WHEN NOT YET WRITTEN)

| $\overline{INIT}$ | D | CLK | Q |
|---|---|---|---|
| L | X | X | L |
| H | L | ↑ | L |
| H | H | ↑ | H |

TRUTH TABLE (2)
(WHEN ALREADY WRITTEN)

| $\overline{INIT}$ | D | CLK | Q |
|---|---|---|---|
| L | X | X | H |
| H | L | ↑ | L |
| H | H | ↑ | H |

TRUTH TABLE

| PRST | CLR | D | CLK | Q |
|------|-----|---|-----|---|
| L | L | X | X | H |
| L | H | X | X | H |
| H | L | X | X | L |
| H | H | L | ↑ | L |
| H | H | H | ↑ | H |

Fig. 9

TRUTH TABLE

| INIT | REAL MEMORY CELL | ML1 | MR1 | INITIAL MEMORY CELL | ML2 | MR2 | CLK | Q | |
|---|---|---|---|---|---|---|---|---|---|
| L | H/L | L(1-2)/H | H/L(1-2) | INFORMATION NON-DESTRUCTION | H | L(0-4) | — | L | INFORMATION OF INITIAL DATA MEMORY CELL |
| L | H/L | L(1-2)/H | H/L(1-2) | INFORMATION DESTRUTION | L(0-4) | H | — | H | " |
| H | L | H | L(1-2) | — | H | H | EXIST | L | INFORMATION OF REAL MEMORY CELL |
| H | H | L(1-2) | H | — | H | H | EXIST | H | " |

INIT

INITIAL DATA
MEMORY CELL

SEMICONDUCTOR MEMORY DEVICE WITH INCREASED ADAPTABILITY

BACKGROUND OF THE INVENTION

1. Field of the Invention

The present invention relates to a semiconductor memory device used in a data processor and, more particularly, to a semiconductor memory device having a programmable read-only memory (PROM) with an output register.

2. Description of the Related Arts

In a conventional PROM with an output register, the storage contents of the PROM are controlled and transferred to an output register in response to a clock signal. The read data is then supplied externally through the output buffer. A conventional semiconductor memory device including a PROM with an output register receives an address input, a chip enable input, a clock input, a preset input, and a clear input, as well as a power supply voltage and ground potential to generate storage contents. In order to increase a memory capacity in such a semiconductor memory device, the number of input/output terminals is an important issue. For example, when a 24-pin IC package is used as a 4-Kbit memory device, all inputs/outputs can be assigned to the pins. However, when the capacity of the IC memory is increased to 8Kbit, the number of address bits is increased by one, one pin is occupied by such increased address bit, and accordingly, the number of pins becomes short. In this case, the clear or preset input must be omitted. This input indicates that the contents of the output register are cleared or set at logic "0" or preset or set at logic "1". Accordingly, given threshold cannot be directly set for the output register to omit read access of the memory, and thus the program cannot be simplified. Therefore, the device loses much of its adaptability, with a resulting loss in the convenience thereof.

A conventional circuit has been proposed to solve the above problem. According to this circuit, an initialize input INIT (barred INIT) is used in place of a clear or preset input, and PROM (real memory cell) or initial data is set in response to the initialize input signal. For example, after the PROM data is multiplexed by an address input (A0 to A2), the multiplexed PROM data is supplied to an initial word and is output. In another conventional circuit, PROM data and separately supplied initial data are multiplexed by the initial data signal INIT and the address input (A0 to A2), and the multiplexed PROM or initial data is output.

The shortage of input terminals can be resolved by the above-mentioned conventional circuits. However, the circuit arrangement is complicated, and a high packing density and high-speed operation cannot be achieved.

SUMMARY OF THE INVENTION

It is the object of the present invention to provide a semiconductor memory device, based on assumptions that an initial data memory cell is arranged, and an output therefrom is supplied to an output register without being passed through a PROM output multiplexer, and that an output level of a logic output from the initial data memory cell differs from a PROM output level, wherein the reduction of adaptability caused by a decrease in input terminals can be prevented, a circuit arrangement can be simplified, and a high degree of integration and high-speed operation can be achieved.

According to the present invention, there is provided a semiconductor memory device including a memory cell array having a plurality of real memory cells; multiplexer unit for selecting the outputs of the memory cell array; an output register unit for receiving the outputs selected by the multiplexer and storing the received data; an initial data memory cell enabling write-in of data; an initialization input terminal for providing a control signal to set the data information written into the initial data memory cell to the output register unit; and an initial data switching circuit unit for supplying to the output register unit an output signal having a predetermined potential in accordance with the data information written in the initial data memory cell, when the control signal is supplied to the initialization input terminal. The predetermined potential of the output signal of the initial data switching circuit unit is different from the potential of the output signal supplied through the multiplexer unit from the memory cell array. The output register is adapted to be set by the output signal of the initial data switching circuit unit, regardless of the output signal from the memory cell array, when the control signal is supplied to the initialization input terminal.

BRIEF DESCRIPTION OF THE DRAWINGS

FIG. 9 is the summarized truth table explaining the entire operations of the device shown in FIG. 3.

DESCRIPTION OF THE PREFERRED EMBODIMENT

Figure 1:
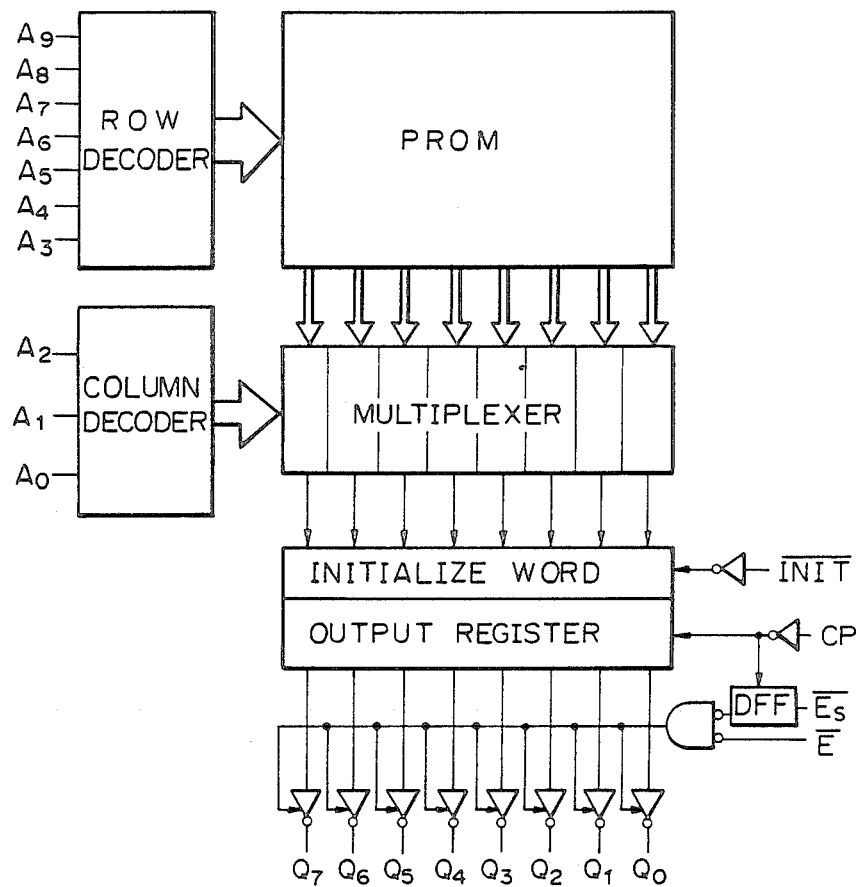
FIGS. 1 and 2 are diagrams showing conventional semiconductor memory devices, respectively.
Figure 2:
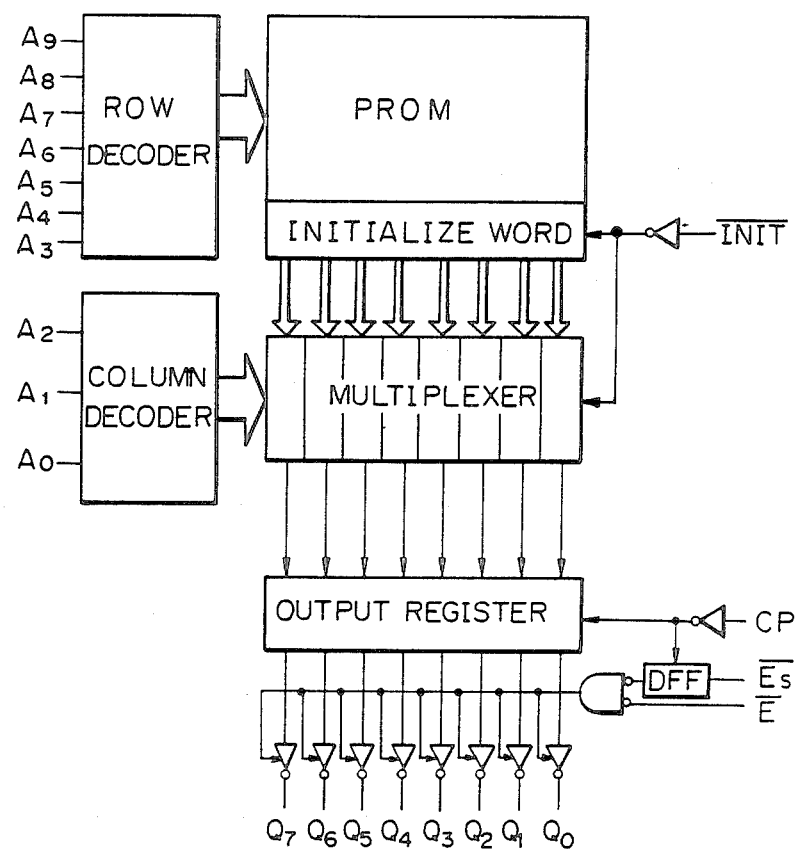

To enable a better understanding of the preferred embodiment according to the present invention, conventional semiconductor devices each with a PROM will be briefly reviewed with reference to FIGS. 1 and 2.

In the devices of FIGS. 1 and 2, an initialize input $\overline{\text{INIT}}$ (barred INIT) is used in place of a clear or preset input. PROM or initial data is set in an output register in response to an initialize input signal. In the device of FIG. 1, the PROM data is multiplexed by address bits A0 to A2. The multiplexed PROM data is supplied to an initial word and is generated therefrom. In the device of FIG. 2, PROM data and separately supplied initial data are multiplexed by the input $\overline{\text{INIT}}$ and address bits A0 to A2, and the multiplexed PROM or initial data is output.

Figure 3:
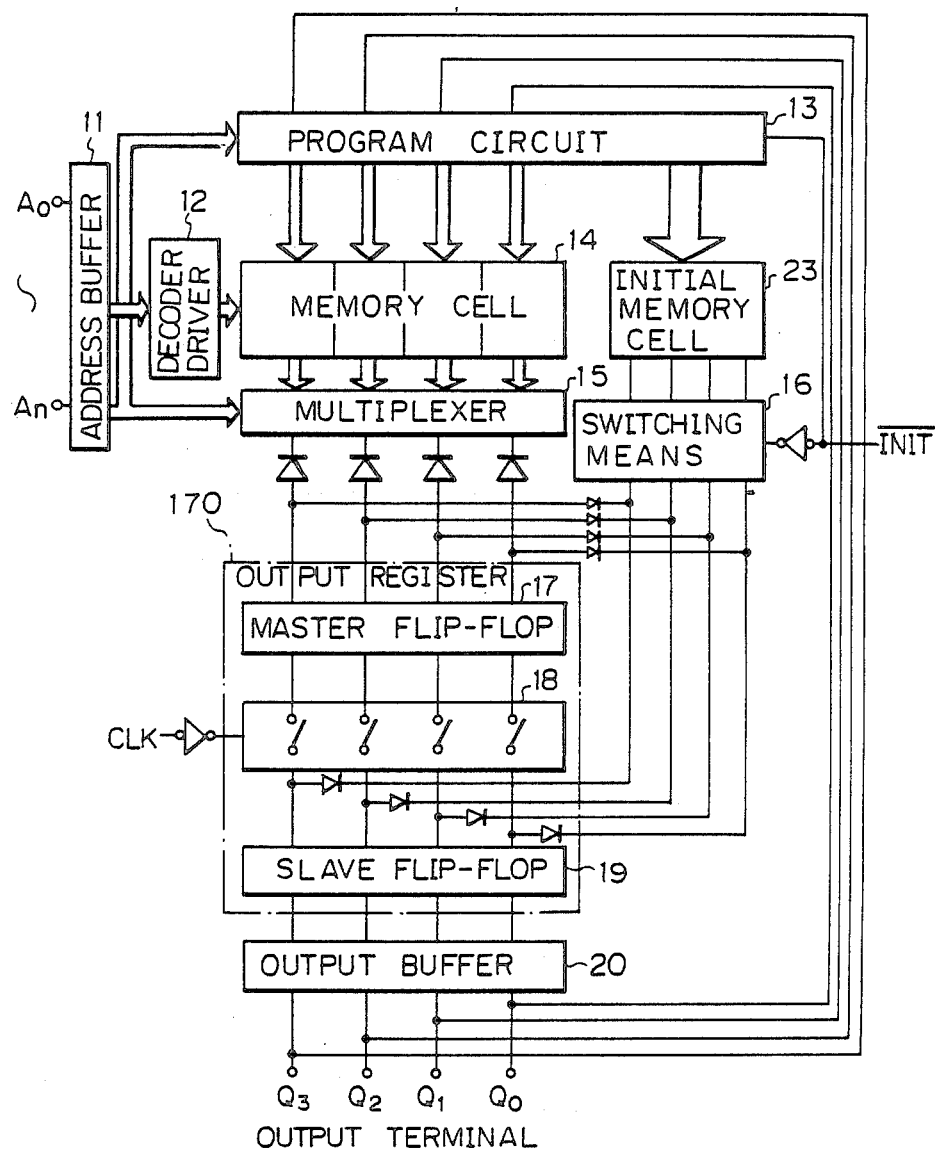
FIG. 3 is a block diagram of a semiconductor memory device according to an embodiment of the present invention.

A semiconductor memory device according to an embodiment of the present invention is illustrated in FIG. 3. This semiconductor memory device comprises: an address buffer 11 for receiving an address signal consisting of bits A0 to An; a decoder driver 12 connected to the address buffer 11 through an address bus; a program circuit 13 for receiving the address signal from the address buffer 11; a real memory cell 14 connected to the decoder driver 12 and the program circuit 13 and storing the PROM data; a multiplexer 15 connected to the address buffer 11 through the address bus and receiving an output from the memory cell 14; a switch 16 receiving an initialize input signal $\overline{\text{INIT}}$ and switching an output from the multiplexer 15; a master flip-flop (F/F) 17 receiving a set of output from the switch 16; a switch 18 for transferring the signal from the master flip-flop 17 in response to a clock (CLK) signal; a slave flip-flop (F/F) 19 receiving the set of outputs from the switch 16 and outputs from the switch 18; an output buffer 20 receiving an output from the slave flip-flop 19; and an initial data memory cell 23 connected to the program circuit 13 and supplying output to the switch 16.

The data from the real memory cell 14 is read out as an output (bits Q0 to Q3) through the multiplexer 15, the master flip-flop 17, the switch 18, the slave flip-flop 19, and the output buffer 20 which are all selected in response to an address signal when the signal $\overline{\text{INIT}}$ is set at high (H) level. The master and slave flip-flops 17 and 19 constitute the output register 170. When the signal $\overline{\text{INIT}}$ is set at low (L) level, the switch 16 is operated to transfer the initial data from the memory cell 23 to the master or slave flip-flop and is output through the output buffer 20. The memory cells 14 and 23 are accessed to write the data therein. In this case, a write signal is supplied to the output (bit Q0 to Q3) terminals to write the data in the memory cell 14 or 23 through the program circuit 13. The memory cell 14 or 23 is selected by the signal $\overline{\text{INIT}}$.

Figure 4:
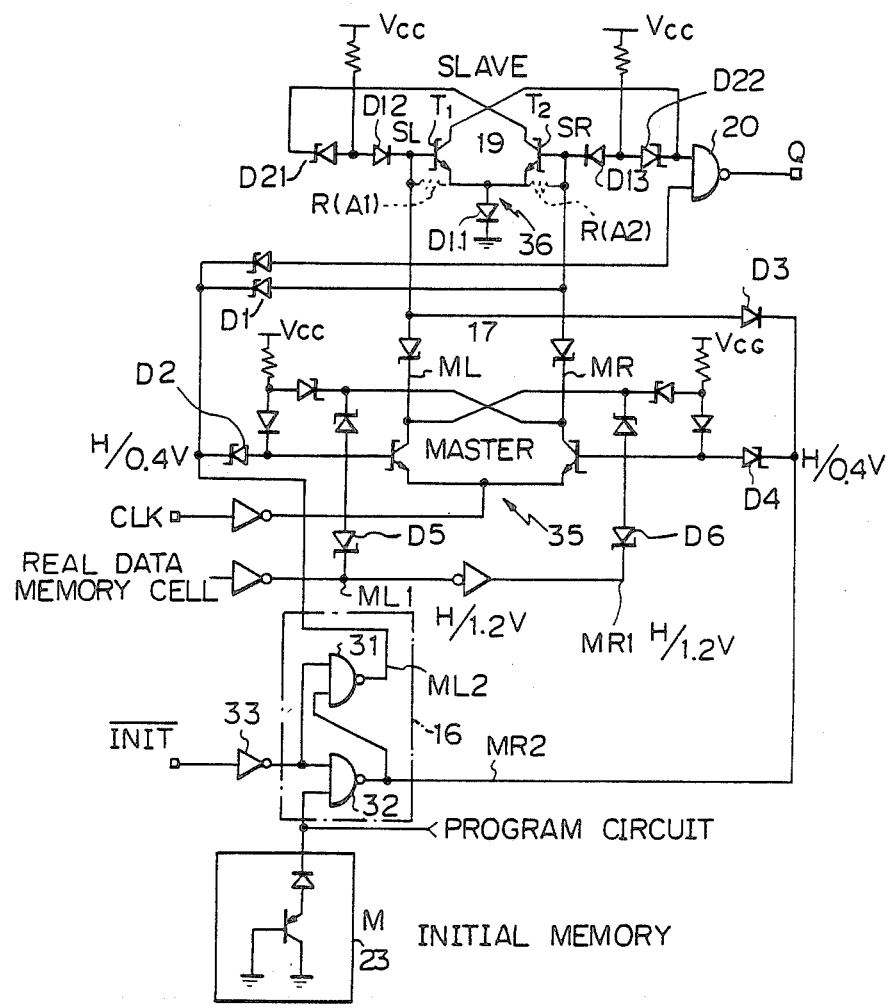
FIG. 4 is a circuit diagram showing part of the semiconductor memory device of FIG. 3.

A detailed arrangement of part of the semiconductor memory device of FIG. 3 is illustrated in FIG. 4. FIG. 4 shows a one-bit output register, its peripheral circuits, logic circuits 31, 32, and 33 and a one-bit initial data memory cell M. The logic circuits 31, 32 constitute the switching means 16 which generate an output signal in accordance with the content of the memory cell M and in response to the signal $\overline{\text{INIT}}$. Diodes D1, D2, D3, D4, D5, and D6 also constitute the switch 16. Outputs (ML1 and MR1) from the real memory cell 14 and outputs (ML2 and MR2) from the initial memory cell 23 are selectively coupled to the flip-flop. A flip-flop (F/F) 35 is one element of the master flip-flop, and a flip-flop 36 is one of the elements of the slave flip-flop.

The slave F/F is composed of a pair of transistors T1 and T2, diodes D11, D12, and D13, and Schottky diodes D21 and D22 for super-high switching. A pair of resistors R(A1) and R(A2) having a high resistance may be connected between the base and grounded emitter of transistors T1 and T2, respectively. The resistors R(A1) and R(A2) are useful for absorbing the transient current, since, when the master mode is switched to the slave mode, the destruction of the slave data information may occur in the course of the switching transfer.

Figures 5A, 5B:
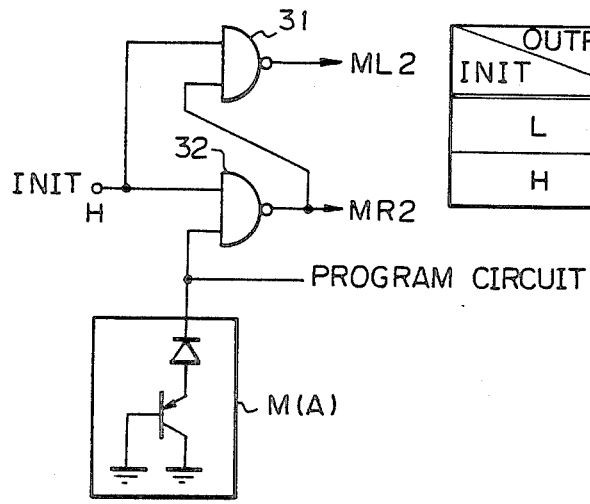
FIG. 5A is a circuit diagram showing a logic circuit and an initial data memory cell in FIG. 4.
FIG. 5B shows a truth table therefor.
Figures 6A, 6B:
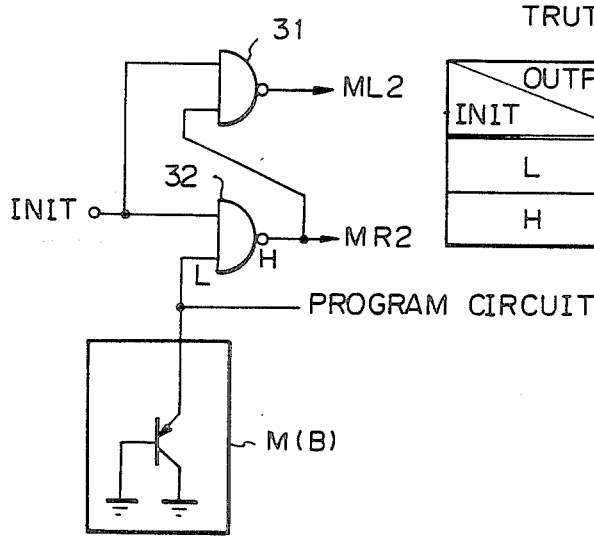
FIG. 6A is a circuit diagram showing an initial data memory cell of a different state from that shown in FIG. 5.
FIG. 6B shows a truth table therefore.

FIGS. 5A, 5B, 6A and 6B show the logic circuits and the initial data memory cells as well as their truth tables, respectively. FIGS. 5A and 5B show a case for writing data in the initial data memory cell M(A), and FIGS. 6A and 6B show a case for writing data in the initial data memory cell M(B). When the program circuit 13 writes data in the initial memory cell M(A), the diode is turned ON, so that the memory cell M(A) is equivalent to the memory cell M(B). By using the logic circuits, i.e., NAND gates 31 and 32, the signal INIT is commonly supplied to the first input terminals thereof. An output from the NAND gate 32 is supplied to the second input terminal of the NAND gate 31, and the second input terminal of the NAND gate 32 is connected to the memory cell M. Logic outputs having levels shown in FIG. 5B appear as outputs (ML2) of the NAND gate 31 and as outputs (MR2) of the NAND gate 32 in accordance with the logic level (H or L) of the signal INIT. More specifically, when the signal INIT is set at low level, the ML2 output is set at high level and the MR2 output is also set at high level. However, when the signal INIT is set at high level, the ML2 output is set at high level, and the MR2 output is set at low level.

The circuit of FIG. 6A is substantially the same as that of FIG. 5A except that the memory cell M(B) is used in place of the memory cell M(A). As is apparent from the truth table of FIG. 6B, when the signal INIT is set at low level, the ML2 output is set at high level and the MR2 output is also set at high level. However, when the signal INIT is set at high level, the ML2 output is set at low level, and the MR2 output is set at high level.

Figures 7A, 7B, 7C:
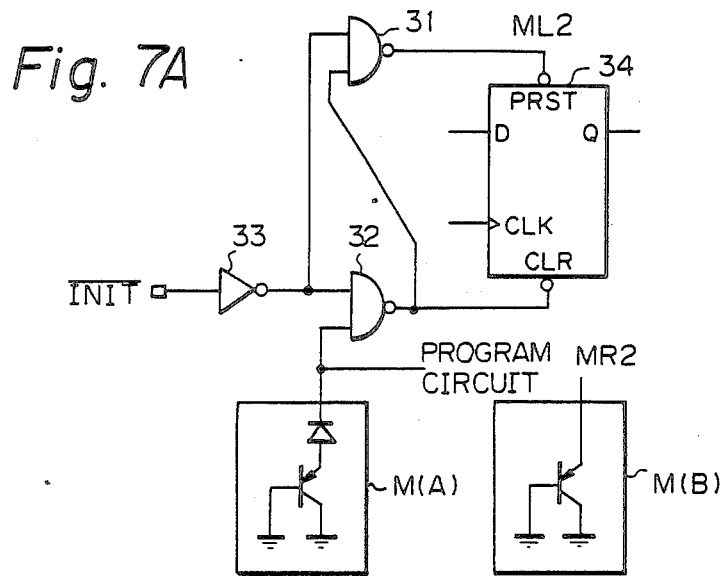
FIG. 7A is a circuit diagram showing electrical connections between the circuit of FIG. 5 and a flip-flop.
FIGS. 7B and 7C show truth tables therefor.

FIGS. 7A, 7B and 7C show a circuit arrangement and its truth tables (1) and (2) when the circuits of FIGS. 5A and 6A are used to drive a flip-flop 34. The flip-flop 34 is a combination of the master and slave flip-flops 17 and 19 of FIG. 3. An inverter 33 is connected to input terminals of the NAND gates 31 and 32, and the signal $\overline{\text{INIT}}$ is supplied to the input terminal of the inverter 33. Truth table (1) (FIG. 7B) shows a state wherein the memory cell does not store data, i.e. the memory cell M(A) is connected, and truth table (2) (FIG. 7C) shows a state when the memory cell M(B) is connected. More particularly, when the memory cell M(A) is connected and the signal $\overline{\text{INIT}}$ is set at low level, an output Q from the flip-flop 34 is set at low level. However, when the signal $\overline{\text{INIT}}$ is set at high level and a D input to the flip-flop 34 is set at low level, the output Q goes low at the leading edge of the clock signal (CLK), i.e., at a transition from low level to high level. When the signal $\overline{\text{INIT}}$ is set at high level and the D input is set at high level, the output Q goes high at the leading edge of the clock signal. However, when the memory cell M(B) is connected and the signal $\overline{\text{INIT}}$ is set at low level, the output Q goes high. When the signal $\overline{\text{INIT}}$ is set at high level, the operation is the same as in the case wherein the memory cell M is connected.

Figures 8A, 8B:
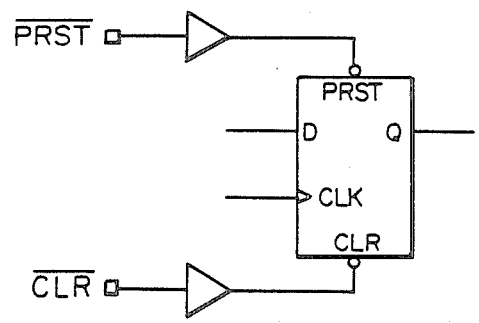
FIG. 8A is a circuit diagram showing a still further conventional semiconductor memory device and FIG. 8B shows a corresponding truth table.

A conventional circuit corresponding to the circuit of FIG. 7A and its truth table are illustrated in FIGS. 8A and 8B. In this conventional circuit, the $\overline{PRST}$ and $\overline{CLR}$ inputs are now replaced with the $\overline{INIT}$ input. Referring to FIGS. 7B, 7C and 8B, reference symbol X denotes an indefinite level, and an upward arrow indicates rising from low level to high level.

FIG. 9 is the summarized truth table explaining the entire operations of the device shown in FIG. 3. In the figure, receiving the output from the real memory cell, a pair of two outputs H and L are produced from the real memory cell. In response to the potential level of PROM data, the signals ML1, MR1 and ML2, MR2 vary. In respect to the upper two L signals of $\overline{INIT}$, the content of the initial memory cell is output, while in respect to the lower two H signals, the content of the real memory cell is output. No mark in the column of initial memory cells denotes regardless of non-destruction or destruction of information and the suffix of H or L denotes the value of voltage.

In summary, the output from the initial data memory cell through the switch and the output from the real memory cell through the multiplexer are connected to the input of the output register through the diode respectivly so that the diodes constitute a diode matrix. And the voltage of the low level output signal from the initial memory cell is 0.4 volt which is lower than that from the real memory cell 1.2 volt. Therefore, when the control signal $\overline{INIT}$ is L, the low level output signal from the initial memory cell set the output register regardless of the output signal from the real memory cell.

Figure 10:
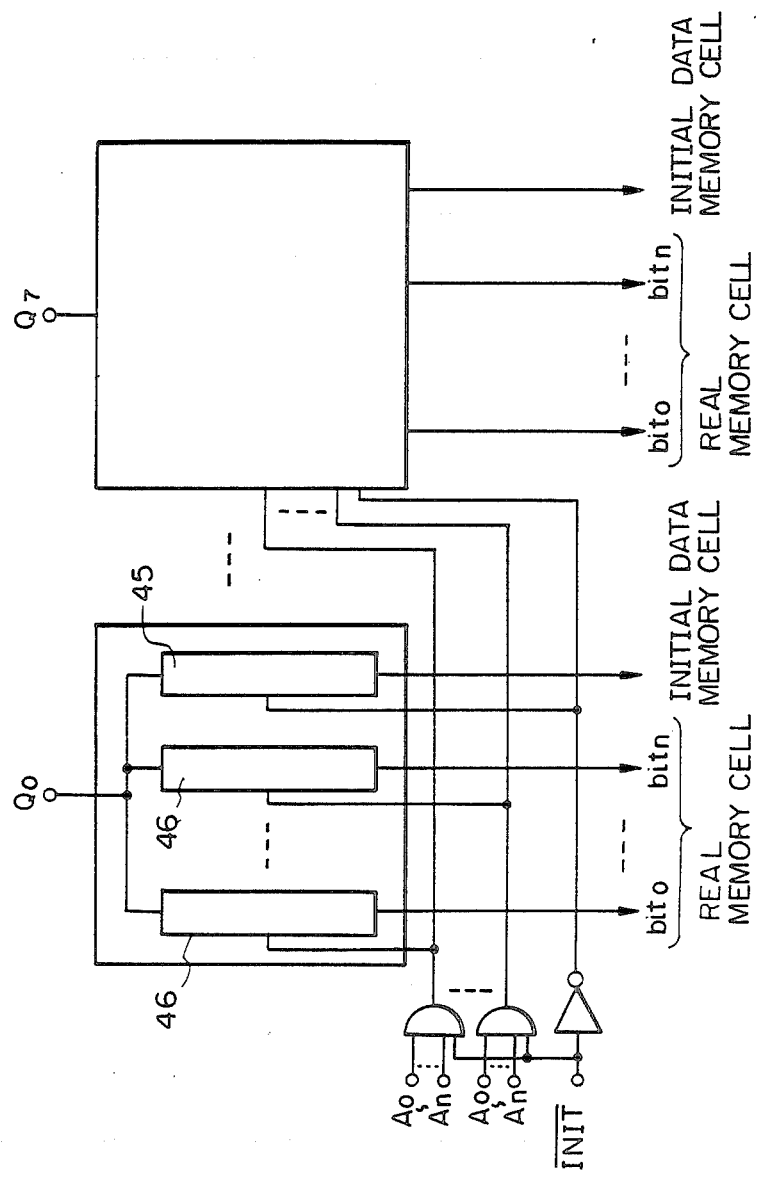
FIG. 10 is a block diagram of a program circuit of the device shown in FIG. 3.
Figure 11:
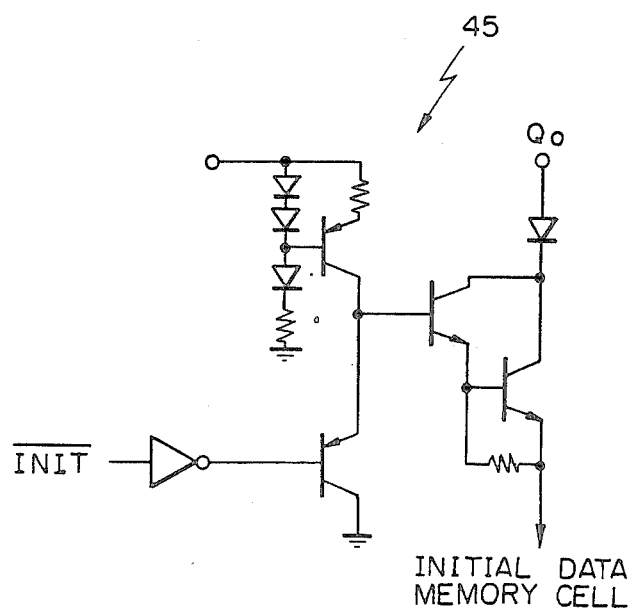
FIG. 11 is a circuit diagram showing part of the circuit of FIG. 10.

FIG. 10 is a block diagram of the program circuit 13. A writer signal externally connected to output bits Q0 to Q3 is supplied to each block of the program circuit in units of bits. The write signal is supplied as parallel data to selectors 45 and 46. The selector 46 selects one of bit lines bit0 to bitn in response to address bits A0 to An, respectively. The selected address data is supplied to the real memory cell 14. The detailed circuit arrangement of the selector 45 is illustrated in FIG. 11. When the signal $\overline{INIT}$ is set at low level, the write signal is supplied to the initial data memory cell. While the signal $\overline{INIT}$ is kept low, the address signal is blocked to disable the selector 46. As a result, the write signal is not supplied to the real memory cell.

Figure 12:
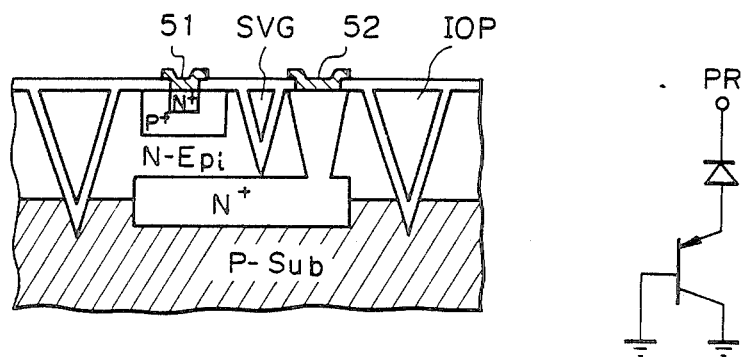
FIG. 12 shows a sectional structure of the initial data memory cell of the device of FIG. 3 and its equivalent circuit.

FIG. 12 shows the initial data memory cell M and its equivalent circuit diagram. Referring to FIG. 12, the memory cell M comprises a P-type substrate (P-Sub), an N(+)-type layer, an N(+)-type epitaxial (N-Epi) layer, a P(+)-type layer, and an N(+)-type layer, which are stacked from the lower side to the upper side. Reference symbols SVG and IOP denote insulating layers, respectively. An electrode 51 is connected to the program circuit (PR), and an electrode 52 is grounded.

Figure 13:
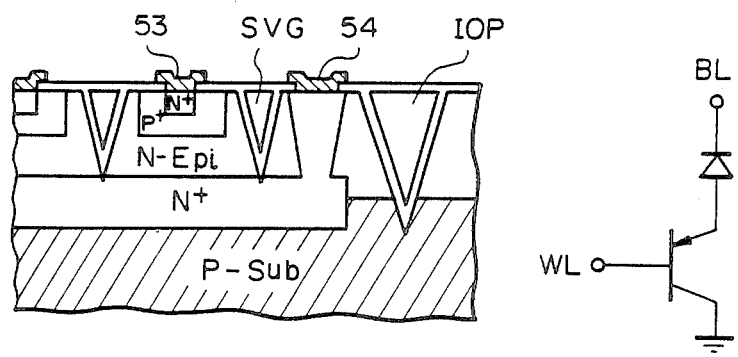
FIG. 13 shows a sectional structure of a PROM data memory cell of the circuit of FIG. 3 and its equivalent circuit.

FIG. 13 shows a sectional view of the real memory cell and its equivalent circuit diagram. An electrode 53 is connected to a bit line (BL) extending from the program circuit, and an electrode 54 is connected to a word line (WL). Other arrangements are the same as those of the memory cell M.

Figure 14:
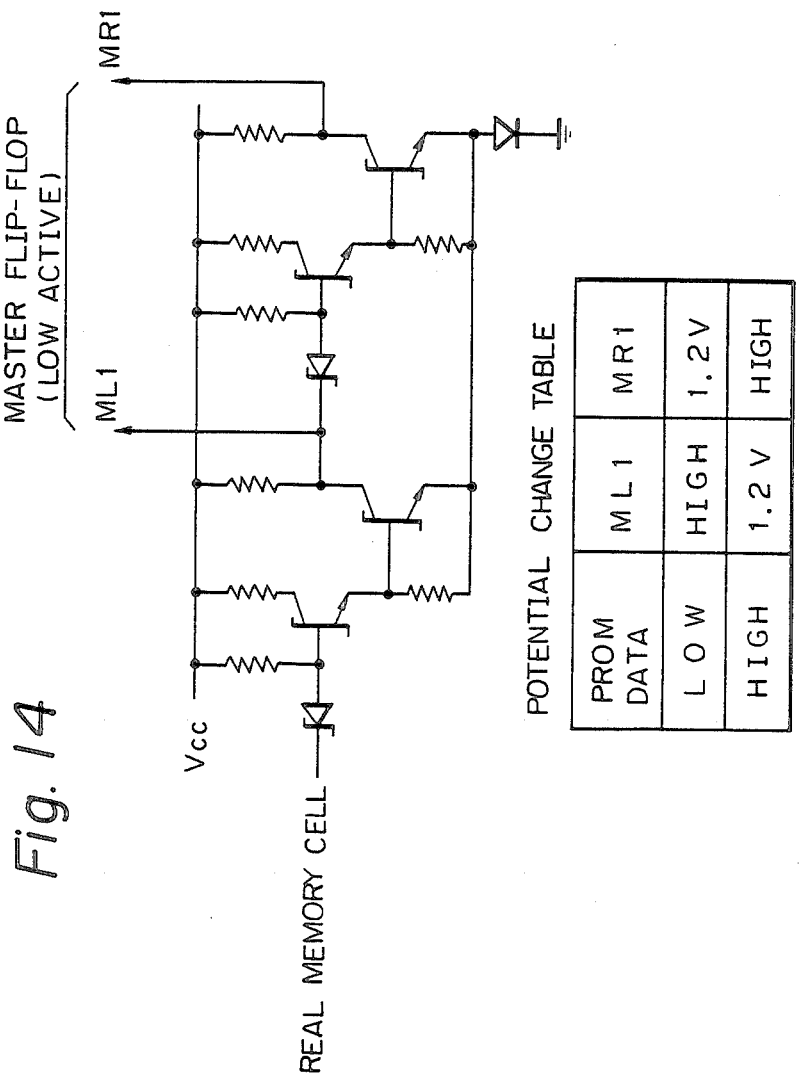
FIGS. 14 and 15 are respectively circuit diagrams showing part of the circuit of FIG. 4 and potential change tables.

FIG. 14 shows a detailed arrangement of the circuit for receiving an output from the real memory cell and generating the signals ML1 and MR1. In this circuit, the signals ML1 and MR1 are set at a potential of 1.2 V in accordance with the logic level of the PROM data, as shown in a potential change table of FIG. 14.

Figure 15:
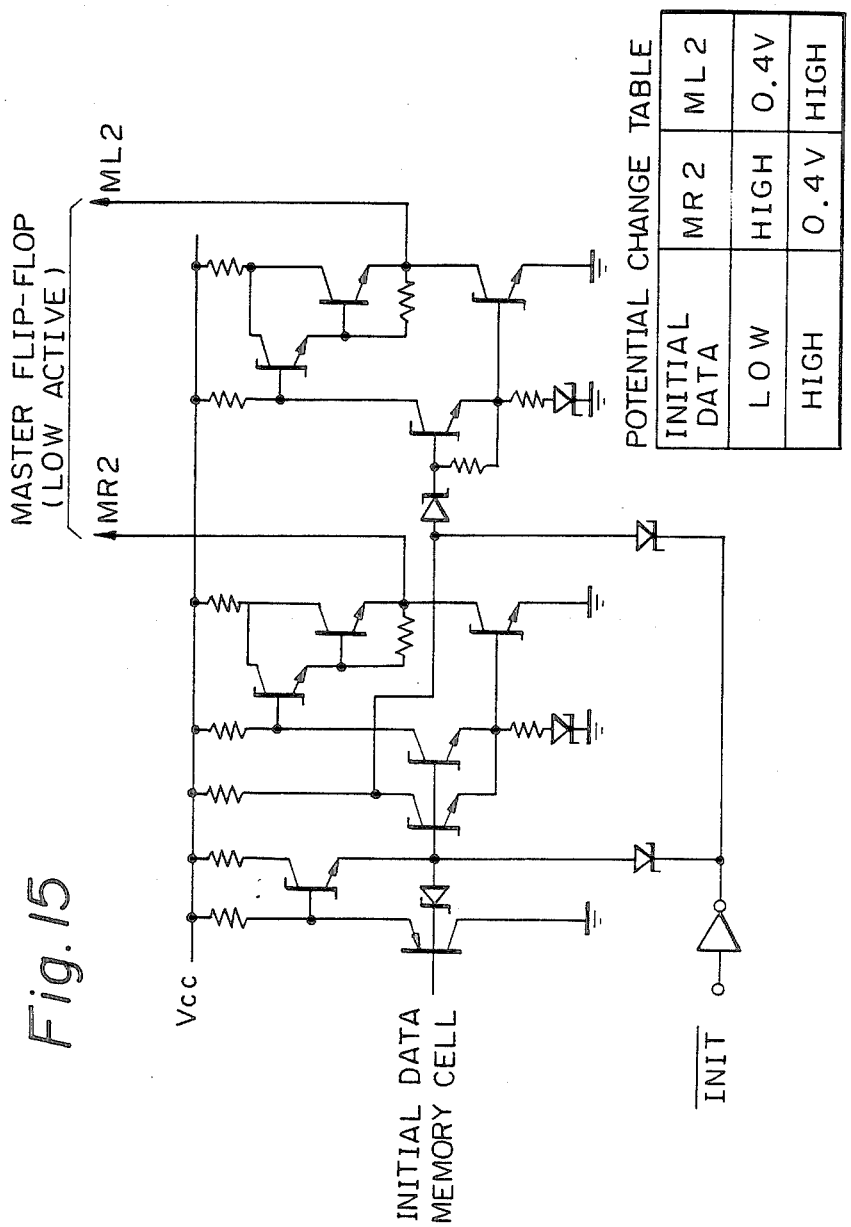

FIG. 15 shows a detailed arrangement of the logic circuits 31, 32, and 33 of FIG. 4. This circuit receives the signal INIT and the signal from the initial data memory cell and performs the operation of the logic circuits of FIG. 4. The outputs MR2 and ML2 are set at a potential of 0.4 V in response to the high level and low level of the output from the initial data memory cell, as shown in a potential change table of FIG. 15. The potential of the signals ML1 and MR1 is different from that of the signals ML2 and MR2, and thus the switch 16 can comprise a simple circuit.

In the circuit of FIG. 15, the $\overline{INIT}$ input is used in place of the $\overline{PRST}$ and $\overline{CLR}$ inputs, and the initial data memory cell is arranged. All "0" or "1" data are written in the initial data memory cell, so that the memory cell is operated in the same manner as in the case wherein the $\overline{PRST}$ or $\overline{CLR}$ signal is received. When arbitrary data are written in bits of the initial data memory cell, respectively, desired data can be set in the output register in response to the $\overline{INIT}$ signal. Since the initial data memory cell is isolated from the real memory cell, an output from the initial data memory cell need not be supplied to the multiplexer 15, i.e., one of the nine bits need not be selected. Furthermore, since the two input signals for controlling the diodes as a switch have a potential difference, the switch can be simplified. The initial data memory cell comprises a junction short-circuit FET which has a high degree of integration and high reliability.

What is claimed is:

1. A semiconductor memory device comprising:
   a memory cell array having a plurality of memory cells;
   multiplexer means for selecting the outputs of said memory cell array;
   an output register means for receiving said outputs selected by said multiplexer and storing the received data;
   an initial data memory cell enabling write-in of data;
   an initialization input terminal for providing a control signal to set the data written into said initial data memory cell to said output register means; and
   an initial data switching circuit means for supplying to said output register means an output signal having a predetermined potential in accordance with the data written in said initial data memory cell, when said control signal is supplied to said initialization input terminal;
   said predetermined potential of said output signal of said initial data switching circuit means being different from the potential of the output signal supplied through said multiplexer means from said memory cell array; and
   said output register being adapted to be set by the output signal of said initial data switching circuit means, regardless of the output signal from said memory cell array, when said control signal is supplied to said initialization input terminal.

2. A device according to claim 1, wherein said initial data memory cell comprises a logic modification memory cell, and said initial data switching circuit means comprises a first and second NAND gates, an initialize input signal being supplied to the first input terminals of both said first and second NAND gates, an output from said second NAND gate being supplied to the second input terminal of said first NAND gate, the terminal of said logic modification memory cell being connected to the second input terminal of said second NAND gate.

3. A device according to claim 1, wherein the output of said initial data switching circuit is coupled to an input of said output register means through a diode (D2, D4), and the output selected by said multiplexer is coupled to said input of said output register means through a diode (D5, D6).

4. A device according to claim 1, wherein said initial data memory cell comprises:
- a P-type substrate, on which are formed a first N(+)type layer, an N(+)type epitaxial layer, a P(+)type layer and a second N(+)type layer which are stacked from the lower side to the upper side;
- a first electrode connected to a program circuit;
- a second electrode connected to the ground; and
- a first and a second insulating layers between which said second electrode is located.

5. A device according to claim 1, wherein each of said plurality of memory cells in said memory cell array comprises:
- a P-type substrate, on which are formed a first N(+) type layer, and N(+) type expitaxial layer, a P(+) type layer and a second N(+) type layer which are stacked from the lower side to the upper side;
- a first electrode connected to a bit line extending from the program circuit;
- a second electrode connected to a word line; and
- first and second insulating layers between which said second electrode is located.

6. A device according to claim 1, wherein said output register means comprises a master flip-flop circuit, a slave flip-flop circuit having an input terminal connected to the output terminal of said master flip-flop circuit, and a resistor having a high resistance being connected between the input terminal of said slave flip-flop circuit and a ground terminal.

* * * * *